(12) United States Patent
McGinley et al.

(10) Patent No.: US 6,208,144 B1
(45) Date of Patent: Mar. 27, 2001

(54) MAGNETIC RESONANCE OPERATING ROOM MAGNET

(75) Inventors: John V. M. McGinley, London; Ian R. Young, Marlborough, both of (GB); Gordon D. DeMeester, Wickliffe, OH (US)

(73) Assignee: Picker International, Inc., Highland Heights, OH (US)

( * ) Notice: Subject to any disclaimer, the term of this patent is extended or adjusted under 35 U.S.C. 154(b) by 0 days.

(21) Appl. No.: 09/315,370

(22) Filed: May 18, 1999

(51) Int. Cl.$^7$ .................................................. G01V 3/00
(52) U.S. Cl. ............................................. 324/319; 324/320
(58) Field of Search .................................. 324/319, 320, 324/318, 322, 300, 307, 309

(56) References Cited

U.S. PATENT DOCUMENTS

| | | |
|---|---|---|
| 5,250,901 | 10/1993 | Kaufman et al. . |
| 5,412,363 | 5/1995 | Breneman et al. . |
| 5,519,372 | 5/1996 | Palkovich . |
| 5,675,305 | 10/1997 | DeMeester et al. . |
| 5,735,278 | 4/1998 | Hoult . |
| 5,864,236 | * 1/1999 | Li ........................................ 324/320 |
| 5,882,304 | 3/1999 | Ehnholm et al. . |
| 5,923,169 | * 7/1999 | Ehnholm et al. .................... 324/319 |

FOREIGN PATENT DOCUMENTS

| | | |
|---|---|---|
| 0 609 604 A1 | 8/1994 | (EP) . |
| 0 818 688 A1 | 1/1998 | (EP) . |

OTHER PUBLICATIONS

FONAR Corporation Web Page, printed May 5, 1999.
U.S. Ser. No. 09/141,708, McGinley et al., Aug. 28, 1998.
U.S. Ser. No. 09/141,990, DeMeester et al., Aug. 28, 1998.
U.S. Ser. No. 09/044,425, DeMeester et al., Mar. 19, 1998.
U.S. Ser. No. 08/972,192, Ehnholm et al., Nov. 18, 1997.

* cited by examiner

Primary Examiner—Louis Arana
(74) Attorney, Agent, or Firm—Fay, Sharpe, Fagan, Minnich & McKee, LLP

(57) ABSTRACT

A region of interest of a subject (20) on a subject support (18) is positioned above a ferrous pedestal (16, 116) that is supported on a ferrous floor yoke portion (76, 176). A lower imaging coil assembly (50) including a lower gradient coil (52), a radio frequency coil (54), and a lower pole piece (58) are disposed between the pedestal and a region of interest of the subject. An upper imaging coil assembly (40) including an annular gradient coil (42, 142) and an upper annular pole piece (44, 144) is supported from a ceiling ferrous yoke member (74, 174). The upper imaging coil assembly is supported by supports (70, 170) which are moved by drives (72, 78, 172) to raise and lower the upper imaging coil assembly. A laser gauging system (80, 180) gauges the position of the upper imaging coil assembly such that, with a control circuit (82), the upper imaging coil assembly is accurately repositioned at preselected imaging positions. A main magnetic field coil (30, 130) is positioned adjacent one of the ceiling ferrous yoke member and the floor ferrous yoke member to provide an asymmetric source of magnetic flux. Pre-polarizing coils (60, 62) are supported on the upper and lower imaging coil assemblies for boosting the magnetic field strength through the region of interest immediately preceding imaging sequences.

19 Claims, 3 Drawing Sheets

MAGNETIC RESONANCE OPERATING ROOM MAGNET

BACKGROUND OF THE INVENTION

The present invention relates to the magnetic resonance arts. It finds particular application in conjunction with magnetic resonance imaging systems for imaging portions of a patient in a surgical site and will be described with particular reference thereto. However, it is to be appreciated that the present invention will also find application in conventional imaging, spectroscopy, combined spectroscopic and imaging applications, and the like.

Heretofore, magnetic resonance imaging systems have surrounded the subject with relatively large and bulky equipment. High field magnetic resonance imaging systems typically receive the patient within a long bore with the imaging region at the geometric center of the bore. Access for surgical procedures is limited at best.

"Open" magnet systems, such as magnetic resonance imaging systems with "C" magnets, provide better physician access. However, large diameter pole pieces are positioned immediately above and below the region of interest of the patent. Typically, the pole pieces have a diameter on the order of 1.5–3 times the space between them for receiving the patient. Reaching into this narrow gap is sufficiently awkward that the patient is typically moved into the bore for imaging and out of the bore for the surgical procedure. Because a patient undergoing surgery is typically interconnected with a plurality of monitors, electrical leads, tubes, intravenous and intra-arterial injections, and the like, moving the patient is considered highly undesirable.

To provide better surgical access, proposals have been made in which the magnet and ferrous flux path structure are enlarged to the size of a small room. To minimize magnetic flux losses, the room is typically small with a low ceiling. The main magnet is positioned low which limits head room, often closely adjacent the region of interest which is typically coincident with the surgeon's work area. Although providing improved access to the patient, these rooms still have drawbacks. The ferrous panels of the flux return path in the ceiling, walls, and floor are heavy. The rooms tend to be claustrophobic. Moreover, the magnet and associate structures still limit surgical access to the region of concern.

The present invention provides a new and improved method and apparatus which overcomes the above-referenced problems and others.

SUMMARY OF THE INVENTION

In accordance with one aspect of the present invention, a magnetic resonance imaging room includes a ferrous pedestal supported on a floor. A lower imaging coil assembly including a gradient coil and a radio frequency coil are supported above the ferrous pedestal. An upper imaging coil assembly including an upper gradient coil and a ferrous pole piece is disposed opposite to the lower imaging coil to define a region of interest therebetween. A main field magnet is disposed asymmetrically adjacent only one of a ceiling above the pedestal or the floor for generating a main magnetic field through the region of interest.

In accordance with another aspect of the present invention, a method of magnetic resonance imaging is provided. A region of interest of a subject is positioned above a ferrous pedestal. A main magnetic field is generated through the region of interest with a main field magnet that is positioned either below an attendant supporting floor surface surrounding the pedestal or adjacent a ceiling above the attendants. The magnetic field is shaped with a lower pole piece disposed below the region of interest and above the pedestal and with an upper pole piece disposed above the region of interest. Gradient magnetic field pulses and radio frequency pulses are generated in the region of interest. Magnetic resonance signals from the region of interest are received and reconstructed into diagnostic images.

One advantage of the present invention is that it improves access to the subject.

Another advantage of the present invention resides in the less claustrophobic atmosphere.

Another advantage of the present invention resides in the high performance imaging capabilities.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating a preferred embodiment and are not to be construed as limiting the invention.

DETAILED DESCRIPTION OF THE PREFERRED EMBODIMENTS

Figure 1:
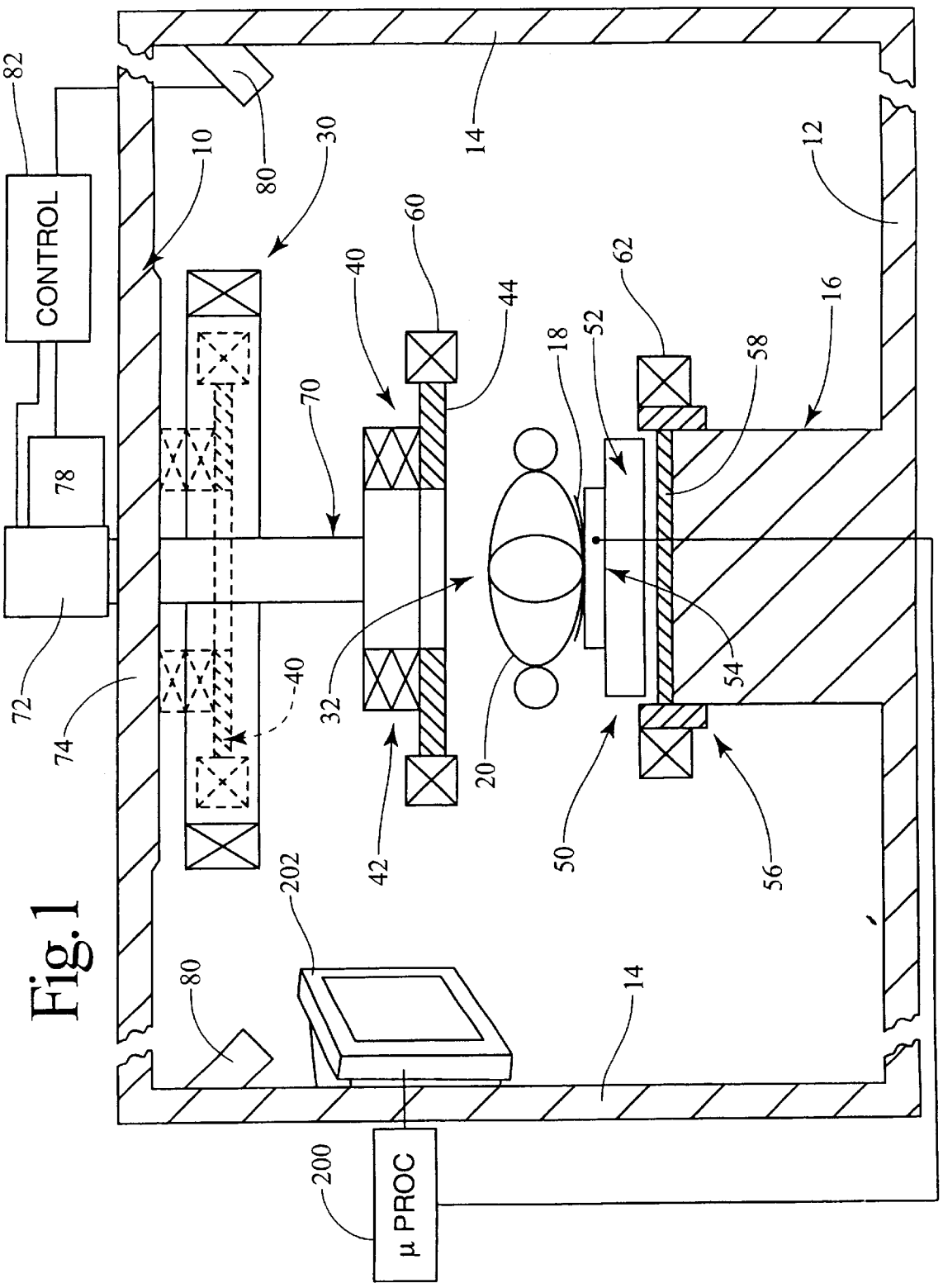
FIG. 1 is an elevational view in partial section of a magnetic resonance operating room in accordance with the present invention.
Figure 2:
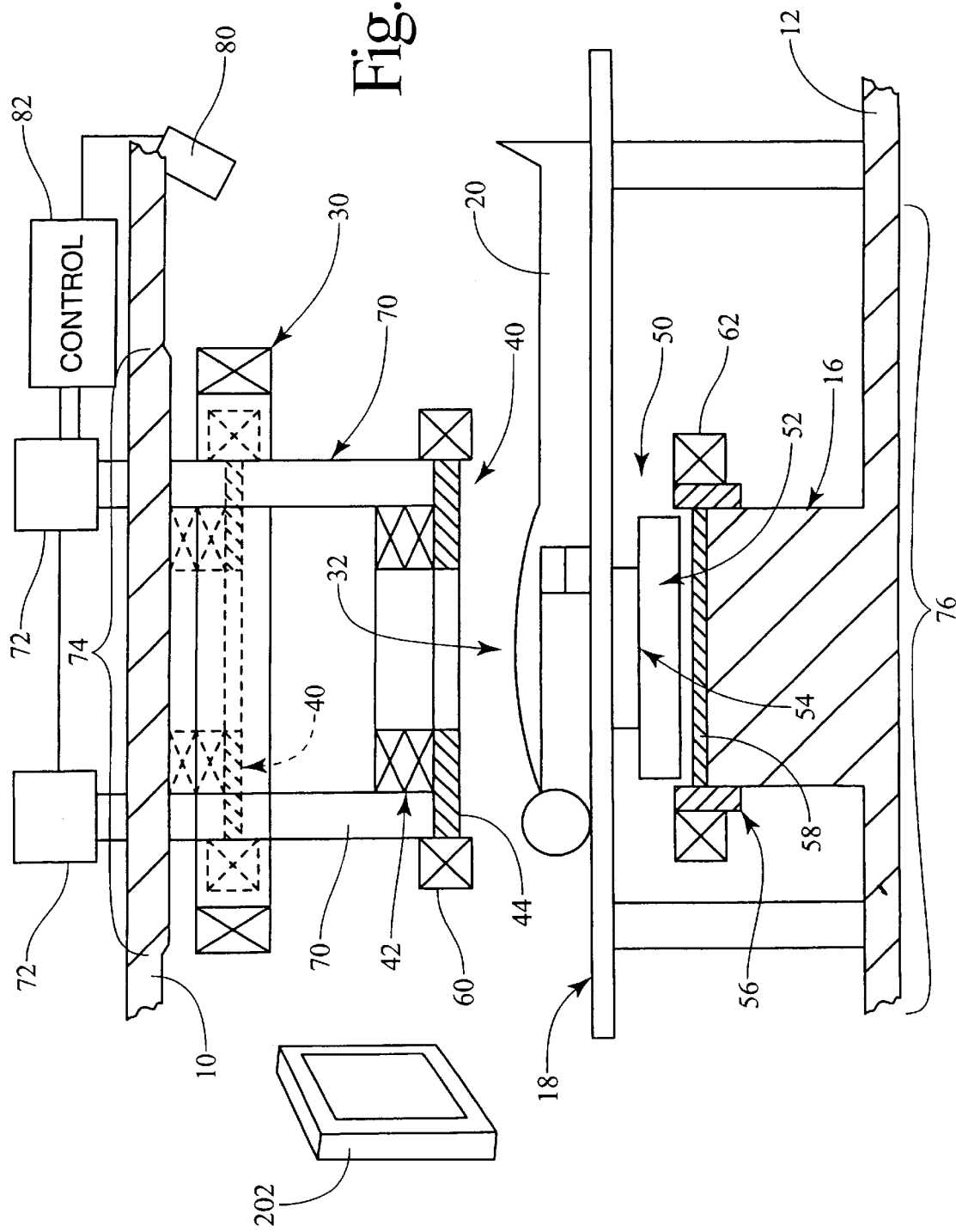
FIG. 2 is an elevational view of the magnetic resonance operating room of FIG. 1 in partial section viewed at 90° to the viewing direction of FIG. 1.

With reference to FIGS. 1 and 2, an operating room includes a ceiling 10 and floor 12. Walls 14 connect the floor and ceiling, leaving appropriate openings for patient and physician access. Optionally, the ceiling, walls, and floor can be constructed in full or in part of ferrous panels to form a flux return path. A lower ferrous plinth or pedestal 16 is disposed generally centrally within the room. A patient couch or support 18 supports a subject 20 above and closely adjacent the lower pedestal 16. The walls are placed a sufficient distance from the patient that the physician has 360° of access.

A main magnet 30 is disposed adjacent the ceiling 10 at least 2 meters from the floor and displaced from the walls 14 by at least the radius of the main magnet. The main field magnet is disposed symmetrically above the lower pedestal 16. Although circular in the preferred embodiment, the main field magnet and the pedestal 16 can have other horizontal cross-sections, such as oval, as may be appropriate to define different shapes for an imaging volume 32.

The main field magnet 30 is preferably a superconducting magnet that operates in a non-persistent mode. That is, although superconducting, the electrical energy in the main field magnet can be quickly channeled to an electrical storage component, or otherwise dissipated, to remove the main magnetic field through the imaging volume. The electrical energy storage element (not shown) is preferably located outside of the operating room. When the magnet is energized, magnetic flux flows primarily through the center of the main field magnet to the lower pedestal, through the floors, walls, and ceiling, if ferrous, to form a flux loop. When no ferrous flux return path is provided, the flux returns through the air. It is to be appreciated, that the asymmetric placement of the main field coil above the imaging volume without an analogous coil disposed symmetrically below the region of interest tends to cause a conical dispersion of magnetic flux paths through the region of interest.

An upper imaging coil assembly 40 is disposed above the imaging volume. The upper imaging coil assembly is preferably annular, defining a central physician access passage. Of course, when such access is not needed, the access passage may be eliminated. The upper imaging coil assembly includes an upper gradient coil 42 and, preferably, a ferrous ring or pole piece or other useful ferromagnetic structures 44 which helps to focus the magnetic flux immediately above the imaging volume through its central passage or portion such that the flux flows more uniformly in substantially vertical, parallel paths through the imaging volume. Preferably, the ferrous ring 44 includes rings or other configurations of different susceptibility materials. Preferably, high susceptibility rings or sections are formed in grooves in a lower susceptibility ferrous structure with planned spacings to optimize main field uniformity. The upper coil assembly may also include active and passive shimming components and radio frequency coils.

A lower imaging coil assembly 50 including a lower gradient coil 52 and a radio frequency coil 54 is disposed below the region of interest and above the column 16. A rose shim 56 and a pole face 58 are disposed below the region of interest for optimizing uniformity. Due to the asymmetric magnetic configuration, the upper and lower pole pieces have different diameters and configurations. Preferably, the lower pole piece is an annular disk that is incorporated into, or even integral with, the column 16. Different, particularly higher, susceptibility materials are disposed centrally and peripherally. Optionally, the column can have voids or cylinders of different susceptibility to improve main field uniformity. The lower coil assembly can also include active shimming.

In the preferred embodiment, the upper imaging coil assembly includes an upper pre-polarizer coil 60 and the lower imaging coil assembly includes a lower pre-polarizer coil 62 disposed above and below the imaging volume. The main magnetic field causes magnetic dipoles within the imaging volume to align selectively with the magnetic field. The stronger the magnetic field, the higher the concentration of aligning dipoles. Once aligned, the dipoles will tend to remain aligned for a nominal duration, particularly in the presence of a weaker magnetic field. In a preferred embodiment, the main field coil 30 working alone generates a magnetic flux on the order of 0.2–0.5 Tesla. The prepolarizer coils, when operating, boost the magnetic flux by 0.5–0.8 Tesla. Thus, working together, the main and prepolarizer magnetic field coils can generate a magnetic flux on the order of 1.0 Tesla in the imaging volume. When the pre-polarizing coils, which tend to produce a less uniform field, are turned OFF, the selective alignment of dipoles typical of a 1.0 Tesla field decays to that found for the lower main field. However, it decays sufficiently slowly relative to time constants T1, such that in the lower field, T1 characteristics of the various tissue appear substantially as in the higher field. In this manner, the selective alignment remains in the imaging volume during the duration of a magnetic resonance imaging sequence, as long as the sequence is not too long. For longer sequences, the pre-polarizing coils can be pulsed intermittently to reestablish the higher concentration of aligned dipoles. Preferably, the pre-polarizer coils are resistive, but non-persistent superconducting coils are also contemplated.

Although a surgeon can reach between the subject and the upper imaging coil assembly and through the access opening in the center of the upper imaging coil assembly, such access is awkward and limiting.

Further to the preferred embodiment, the upper coil assembly 40 is supported from above by vertical posts or drive supports 70 which are connected with vertical drives 72, such as hydraulic cylinders, robotics, cables, gears, or the like, for raising the upper imaging coil assembly to the ceiling height for easy access and lower it to an imaging position. The posts 70 may be constructed of ferrous material to form part of the flux circuit. The magnetic flux passing through the upper imaging coil assembly magnetizes ferrous components creating magnetomotive forces that attract the assembly upward toward the main coil 30. A ferrous upper yoke portion 74 may be mounted in the ceiling which has a mirroring effect that increases the upward magnetomotive force on the main magnet and the upper imaging coil. The mirror force pulls the main magnet upward facilitating suspension constructions. The ferrous pedestal 16 and a lower yoke portion 76 create an analogous magnetic mirror that, with gravity, urges the upper coil assembly downward. In the imaging position, the upper imaging coil assembly is positioned such that the downward magnetomotive and gravitational forces are offset and balanced by the upward magnetomotive force. Preferably, the main field coil 30 and the pre-polarizing coils 60, 62 are deactivated during raising and lowering of the upper imaging coil assembly. Preferably, additional coordinated drives 78 are provided in conjunction with the upper and lower coil assemblies for tipping one or both coil assemblies coordinately, for different main field orientations. When the main magnet and the pedestal are not circularly symmetric, the drives 76 also are capable of rotational movement to optimize the alignment of another shaped imaging volume, e.g., ellipsoidal, with a region of interest in the patient. Preferably, the coil assemblies are movable with 6 degrees of freedom.

Magnetic resonance imaging systems are precision equipment. Relatively small physical changes in equipment configuration can change imaging characteristics. When the coil assemblies are moved away and returned, the coil assemblies should be repositioned accurately to provide consistent imaging characteristics from imaging session to imaging session. To this end, a laser gauging system including lasers 80 mounted on the ceiling or walls of the operating room accurately measure the position of the upper imaging coil assembly. The lasers are connected with a drive control circuit 82 for causing the drives 72, 78 to adjust the position of the imaging coil assemblies until they have been returned accurately to a prescribed location. Of course, the prescribed location may be different for different imaging procedures. For example, the prescribed position of the upper gradient coil assembly may be different distances from the subject for imaging procedures with different fields of view or the like.

Optionally, other positioning devices may be utilized, including laser interferometry, photo-electric microscopes, magnetic flux sensing probes, and the like.

In practice, the upper imaging coil assembly is positioned at a preselected imaging location. The coil is then shimmed to optimize imaging performance. The exact imaging position(s) of the upper imaging coil is recorded. Thereafter, each time an analogous imaging sequence is to be performed, the upper imaging coil is brought to the precise same position. Active shimming coils facilitate the positioning of the coil in more than one preselected location for different imaging sequences and optimizing the shimming at each.

Figure 3:
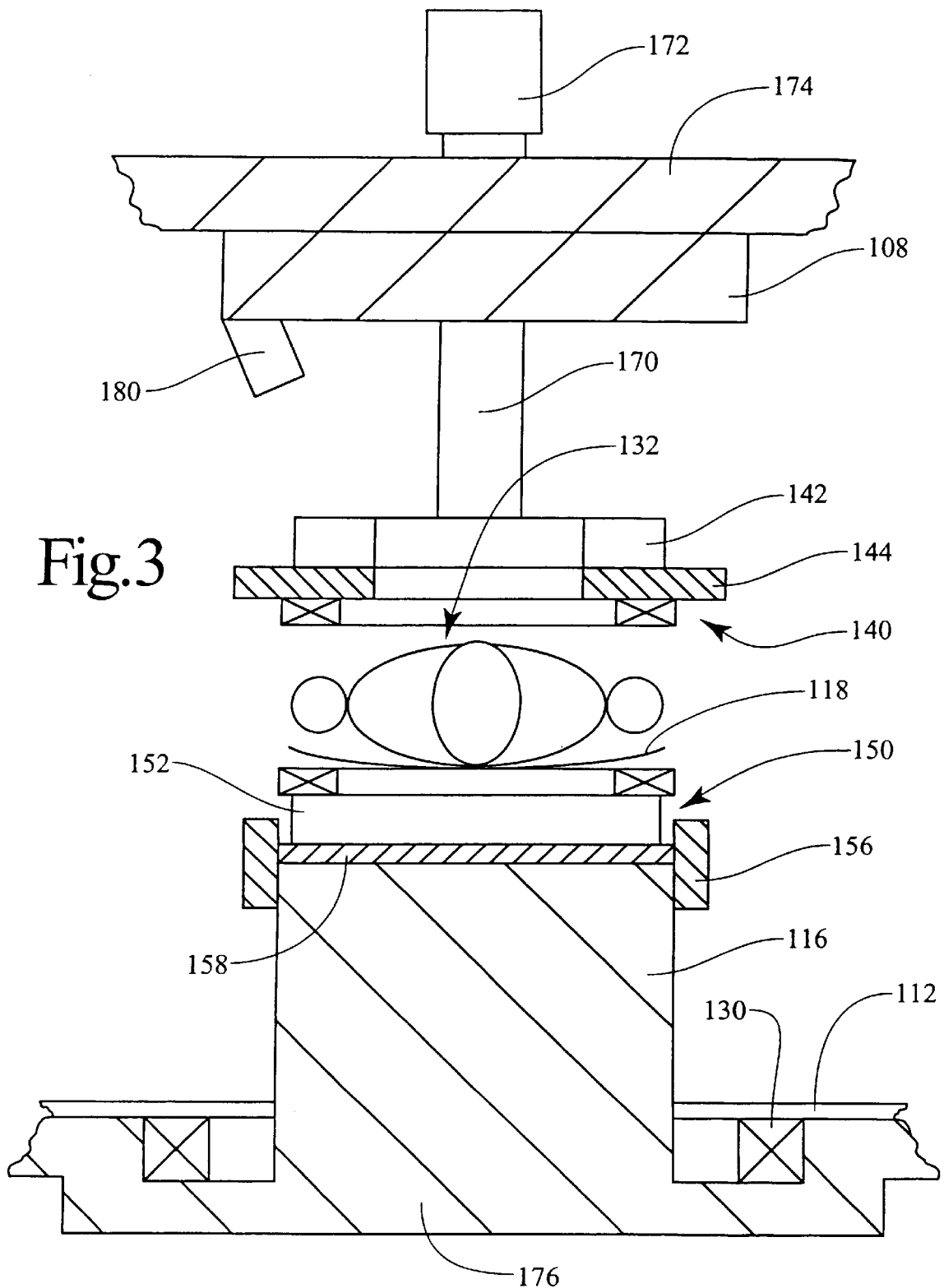
FIG. 3 is an elevational view in partial section of an alternate embodiment.

With reference to FIG. 3, other asymmetric main field coil placements are also contemplated. A ferrous sub-floor yoke piece 176 supports a ferrous column 116. A ceiling ferrous yoke piece 174 is disposed above the ceiling with a ferrous protrusion 108 disposed symmetrically above the column 116. Optionally, ferrous return paths are provided through surrounding walls.

A main field magnet 130 is supported below a non-ferrous floor surface which is disposed above the magnet to support surgeons and peripheral equipment, such as a patient support 118.

The pedestal 116 supports a lower imaging coil assembly 150 including a radio frequency coil 152, and a rose shim 156 and a pole face 158 for shaping and improving uniformity of the magnetic field through an imaging volume 132.

An upper imaging coil assembly 140 includes an annular gradient coil 142 and an annular pole piece, a cylinder with profiled faces, or other flux shaping element 144 for shaping and focusing the magnetic field.

The main field magnet is again preferably non-persistent (if superconducting) so that the main field can be demagnetized when the upper imaging coil assembly is raised on vertical drive supports 170 by vertical drives 172. Again, tipping and canting of the upper and lower imaging coils is also contemplated. A precision position monitoring system 180, such as a laser interferometry system, controls the precise positioning of the upper imaging coil assembly.

In operation, a patient is positioned in the patient support with a region of interest in the imaging volume. The patient is prepared for surgery including connecting monitors, drip tubes, IVS, and the like. A surface RF receiving coil is positioned on the patient or the RF coils in one or both of the imaging coil assemblies 40, 50 or other pick-up coils are positioned adjacent the region of interest. Magnetic resonance imaging sequences are conducted and the resultant magnetic resonance data from the RF coils is reconstructed by a reconstruction processor 200 into electronic diagnostic image representations. Monitors 202 which are preferably in the operating room, convert the electronic image representations into human-readable displays. The main magnet is deactivated, the upper imaging coil assembly is retracted, and the surgical procedure commenced. Where appropriate, the upper imaging coil is lowered, the main field magnet is energized, the surface coil is repositioned, and additional images are generated during the surgical procedure.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. A magnetic resonance imaging room comprising:
   a ferrous pedestal supported on a floor;
   a lower imaging coil assembly including a gradient coil and a radio frequency coil supported above the ferrous pedestal;
   an upper imaging coil assembly including an upper gradient coil and a ferrous pole piece, the upper imaging coil assembly being disposed opposite to the lower imaging coil assembly to define an imaging volume therebetween; and,
   a main field magnet disposed asymmetrically adjacent only one of a ceiling and the floor for generating a main magnetic field through the imaging volume;
   wherein the upper gradient coil and the upper pole piece are annular to define a central passage therethrough in alignment with the imaging volume.

2. A magnetic resonance imaging room comprising:
   a ferrous pedestal supported on a floor;
   a lower imaging coil assembly including a gradient coil and a radio frequency coil supported above the ferrous pedestal;
   an upper imaging coil assembly including an upper gradient coil and a ferrous pole piece, the upper imaging coil assembly being disposed opposite to the lower imaging coil assembly to define an imaging volume therebetween; and,
   a main field magnet disposed asymmetrically adjacent only one of a ceiling and the floor for generating a main magnetic field through the imaging volume;
   wherein at least one of the upper and lower imaging coil assemblies includes a pre-polarizer coil for boosting the main magnetic field through the imaging volume between imaging sequences.

3. A magnetic resonance imaging room comprising:
   a ferrous pedestal supported on a floor;
   a lower imaging coil assembly including a gradient coil and a radio frequency coil supported above the ferrous pedestal;
   an upper imaging coil assembly including an upper gradient coil and a ferrous pole piece, the upper imaging coil assembly being disposed opposite to the lower imaging coil assembly to define an imaging volume therebetween; and,
   a main field magnet disposed asymmetrically adjacent only one of a ceiling and the floor for generating a main magnetic field through the imaging volume;
   wherein the main field magnet is between 1.5 and 3 times a diameter of the upper imaging coil assembly.

4. The magnetic resonance imaging room as set forth in claim 3 further including:
   an upper ferrous yoke portion disposed along the ceiling adjacent the main field magnet;
   a lower ferrous yoke portion supporting the ferrous pedestal;
   a ferrous member extending through peripheral walls of the room between the upper and lower yoke pieces, the main field magnet being displaced from the wall ferrous members by at least a major radius of the main field magnet.

5. A magnetic resonance imaging room comprising:
   a ferrous pedestal supported on a floor of the room;
   a lower imaging coil assembly including a gradient coil and a radio frequency coil, said lower imaging coil assembly being supported above the ferrous pedestal;
   an upper imaging coil assembly including an upper gradient coil and a ferrous pole piece, said upper imaging coil assembly being disposed opposite to the lower imaging coil assembly to define an imaging volume therebetween;
   a main field magnet for generating a main magnetic field through the imaging volume, said main field magnet being disposed adjacent a ceiling of the room; and,
   a drive system for moving the upper imaging coil assembly between an imaging position adjacent the imaging volume and a retracted position away from the imaging volume, said drive system moving the upper imaging coil assembly linearly upward into the retracted position wherein the upper imaging coil is nested inside the main field magnet.

6. The magnetic resonance imaging room as set forth in claim 5 wherein the drive system includes a vertical drive for raising and lowering the upper imaging coil.

7. The magnetic resonance imaging room as set forth in claim 5 wherein the main field magnet is a non-persistent superconducting magnet which can be de-energized as the upper imaging coil assembly is moved.

8. The magnetic resonance imaging room as set forth in claim 7 wherein:
when the main magnetic field magnet is ON, the upper imaging coil assembly is attracted upward toward the ceiling yoke portion and downward toward the pedestal, the position of the ceiling yoke portion and the pedestal being selected relative to the imaging position such that the upward and downward forces on the upper imaging coil assembly balance in the imaging portion.

9. The magnetic resonance imaging room as set forth in claim 5 further including a ferrous yoke portion mounted to the ceiling above the pedestal and displaced above the upper imaging coil assembly.

10. A magnetic resonance imaging room comprising:
a ferrous pedestal supported on a floor;
a lower imaging coil assembly including a gradient coil and a radio frequency coil supported above the ferrous pedestal;
an upper imaging coil assembly including an upper gradient coil and a ferrous pole piece, the upper imaging coil assembly being disposed opposite to the lower imaging coil assembly to define an imaging volume therebetween;
a main field magnet disposed asymmetrically adjacent one of a ceiling and the floor for generating a main magnetic field through the imaging volume;
a drive system for moving the upper imaging coil assembly between an imaging position adjacent the imaging volume and a retracted position away from the imaging volume; and,
a position measuring system for measuring the position of the upper imaging coil assembly.

11. The magnetic resonance imaging room as set forth in claim 10 further including a feedback control circuit connected with the position measuring system and the drive system for precisely positioning the upper imaging coil in the imaging position.

12. A method of magnetic resonance imaging comprising:
positioning a region of interest of a subject in an imaging volume above a ferrous pedestal;
generating a main magnetic field through the imaging volume with a main field magnet positioned one of (a) below an attendant supporting floor surface surrounding the pedestal and (b) adjacent a ceiling above attendants;
shaping the main magnetic field with a lower pole piece disposed below the imaging volume and above the pedestal and with an upper pole piece disposed above the imaging volume;
generating gradient magnetic field pulses and radio frequency pulses in the imaging volume; and,
receiving magnetic resonance signals from the imaging volume and reconstructing the magnetic resonance signals into diagnostic images of the region of interest;
wherein the upper pole piece is annular to provide access through a central opening thereof for performing surgical procedures on the subject without moving the region of interest out of the imaging volume.

13. A method of magnetic resonance imaging comprising:
positioning a region of interest of a subject in an imaging volume above a ferrous pedestal;
generating a main magnetic field through the imaging volume with a main field magnet positioned one of (a) below an attendant supporting floor surface surrounding the pedestal and (b) adjacent a ceiling above attendants;
shaping the main magnetic field with a lower pole piece disposed below the imaging volume and above the pedestal and with an upper sole niece disposed above the imaging volume;
generating gradient magnetic field pulses and radio frequency pulses in the imaging volume;
receiving magnetic resonance signals from the imaging volume and reconstructing the magnetic resonance signals into diagnostic images of the region of interest;
after generating the gradient and radio frequency pulses, moving the upper pole piece away from the subject;
lowering the upper pole piece in preparation for another magnetic resonance imaging sequence;
monitoring the position of the upper pole piece; and,
controlling positioning of the upper pole piece to position it accurately in a preselected imaging position.

14. The method as set forth in claim 13 further including:
prior to moving the upper pole piece, deactivating the main magnetic field.

15. The method as set forth in claim 13 further including:
canting at least one of the upper and lower pole pieces.

16. A method of magnetic resonance imaging comprising:
positioning a region of interest of a subject in an imaging volume above a ferrous pedestal;
generating a main magnetic field through the imaging volume with a main field magnet positioned one of (a) below an attendant supporting floor surface surrounding the pedestal and (b) adjacent a ceiling above attendants;
shaping the main magnetic field with a lower pole piece disposed below the imaging volume and above the pedestal and with an upper pole piece disposed above the imaging volume;
generating gradient magnetic field pulses and radio frequency pulses in the imaging volume;
receiving magnetic resonance signals from the imaging volume and reconstructing the magnetic resonance signals into diagnostic images of the region of interest;
prior to applying gradient and radio frequency pulses, applying a pre-polarizing magnetic field to boost the main magnetic field in the region of interest; and,
terminating application of the pre-polarizing field prior to application of the gradient magnetic field and radio frequency pulses.

17. A magnet assembly for resonance imaging, the magnet assembly comprising;
a lower ferrous yoke portion;
a upper ferrous yoke portion disposed displaced form the lower ferrous yoke portion to define an open air magnetic flux path in an open air region therebetween;
a single, annular main field magnet disposed adjacent the upper ferrous yoke portion and around the open air flux path, magnetic flux in the open air flux path flowing in part in a divergent path between the upper and lower yoke portions;

a lower coil assembly disposed adjacent the lower yoke portion for adjusting the magnetic flux in the open air region; and, an upper coil assembly for converging the magnetic flux in the open air region between the upper and lower coil assemblies to define an imaging volume;

wherein the main field magnet has a substantially larger diameter than the lower coil assembly.

18. The magnet assembly as set forth in claim 17 further including:

a drive for moving the upper coil assembly between a first preselected position adjacent the imaging volume and a retracted position away from the imaging volume.

19. A magnetic resonance imaging system comprising:

a lower ferrous yoke portion;

a ferrous pedestal supported on the lower yoke portion;

a lower imaging coil assembly supported above the pedestal;

an upper imaging coil assembly disposed above the lower imaging coil assembly defining an imaging volume therebetween;

an upper ferrous yoke portion disposed above the upper imaging coil assembly; and, a single main field coil magnet disposed asymmetrically adjacent one of the upper and lower yoke portions, said main field coil magnet being vertically and peripherally displaced from the upper and lower imaging coil assemblies;

an image reconstruction system for reconstructing magnetic resonance signals from the imaging volume into an electronic image representation;

a monitor for converting selected portions of the electronic image representation.

\* \* \* \* \*